United States Patent
Porter et al.

(10) Patent No.: US 8,858,003 B2
(45) Date of Patent: Oct. 14, 2014

(54) PHYSICAL FORCE CAPACITIVE TOUCH SENSORS HAVING CONDUCTIVE PLANE AND BACKLIGHTING

(75) Inventors: Stephen B. Porter, Gilbert, AZ (US); Keith Curtis, Gilbert, AZ (US); Fanie Duvenhage, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 342 days.

(21) Appl. No.: 13/468,504

(22) Filed: May 10, 2012

(65) Prior Publication Data

US 2012/0217147 A1    Aug. 30, 2012

Related U.S. Application Data

(63) Continuation-in-part of application No. 12/787,474, filed on May 26, 2010, now Pat. No. 8,408,723, and a continuation-in-part of application No. 12/556,191, filed on Sep. 9, 2009, now abandoned.

(60) Provisional application No. 61/238,718, filed on Sep. 1, 2009, provisional application No. 61/108,648, filed on Oct. 27, 2008.

(51) Int. Cl.
*G06F 3/044* (2006.01)
*H03K 17/96* (2006.01)
*G06F 3/02* (2006.01)

(52) U.S. Cl.
CPC ............ *H03K 17/962* (2013.01); *G06F 3/0202* (2013.01); *G06F 3/044* (2013.01); *H03K 2217/960755* (2013.01); *H03K 2217/960785* (2013.01); *H03K 2217/960795* (2013.01); *H03K 2217/9655* (2013.01)
USPC .................................. 362/23.03; 362/23.05

(58) Field of Classification Search
CPC ................................ G06F 3/0202; G06F 3/044
USPC .............................................. 362/23.03, 23.05
See application file for complete search history.

(56) References Cited

U.S. PATENT DOCUMENTS

| 4,417,294 A | 11/1983 | Herron, Jr. ..................... 361/288 |
| 5,546,806 A | 8/1996 | Kain .......................... 73/514.31 |

(Continued)

FOREIGN PATENT DOCUMENTS

| EP | 2048781 A1 | 4/2009 | ............. H03K 17/96 |
| WO | 2006/064234 A1 | 6/2006 | ............. H03K 17/97 |

(Continued)

OTHER PUBLICATIONS

Curtis, Keith, "Inductive Touch Sensor Design," Microchip Technology Inc., Brochure AN1239, 14 pages, © 2008.

(Continued)

*Primary Examiner* — David V Bruce
(74) *Attorney, Agent, or Firm* — King & Spalding L.L.P.

(57) ABSTRACT

A physical force capacitive touch sensor comprises a capacitive sensor element on a substrate, a physically deformable electrically insulating spacer over the capacitive sensor element and a conductive plane over the physically deformable electrically insulating spacer. A protective fascia may be placed over the conductive plane provides an environmental seal for physical and weather protection, but is not essential to operation of the capacitive touch sensor. Back lighting is accomplished with a light transmissive layer having a suspended metal target proximate to the capacitive touch sensor plate. When the light transmissive layer and metal target are displaced toward the capacitive touch sensor plate the capacitance value of the capacitive touch sensor plate changes and that change is detected.

11 Claims, 8 Drawing Sheets

(56) References Cited

U.S. PATENT DOCUMENTS

| | | |
|---|---|---|
| 6,595,653 B2 | 7/2003 | Saito et al. .................. 362/84 |
| 6,997,572 B2 | 2/2006 | Ono et al. .................. 362/23.06 |
| 7,296,485 B2 | 11/2007 | Kain .................. 73/862 |
| 7,667,947 B2 | 2/2010 | Schilling et al. .................. 361/290 |
| 2002/0144886 A1 | 10/2002 | Engelmann et al. .......... 200/600 |
| 2003/0234769 A1 | 12/2003 | Cross et al. .................. 345/173 |
| 2008/0018611 A1 | 1/2008 | Serban .................. 345/173 |
| 2008/0309589 A1 | 12/2008 | Morales .................. 345/36 |
| 2009/0067151 A1 | 3/2009 | Sahlin et al. .................. 362/23.03 |
| 2009/0243817 A1 | 10/2009 | Son .................. 340/407.2 |
| 2010/0081374 A1 | 4/2010 | Moosavi .................. 455/41.1 |
| 2010/0309030 A1* | 12/2010 | Huang et al. .................. 341/33 |

FOREIGN PATENT DOCUMENTS

| | | | |
|---|---|---|---|
| WO | 2008/009687 A2 | 1/2008 | .............. G06F 3/041 |
| WO | 2008/012491 A1 | 1/2008 | .............. G06F 3/033 |

OTHER PUBLICATIONS

International Search Report and Written Opinion, Application No. PCT/US2009/062054, 8 pages, Jan. 15, 2010.

International Search Report and Written Opinion, Application No. PCT/US2010/044845, 11 pages, Oct. 26, 2010.

* cited by examiner

FIGURE 1 (Prior Technology)

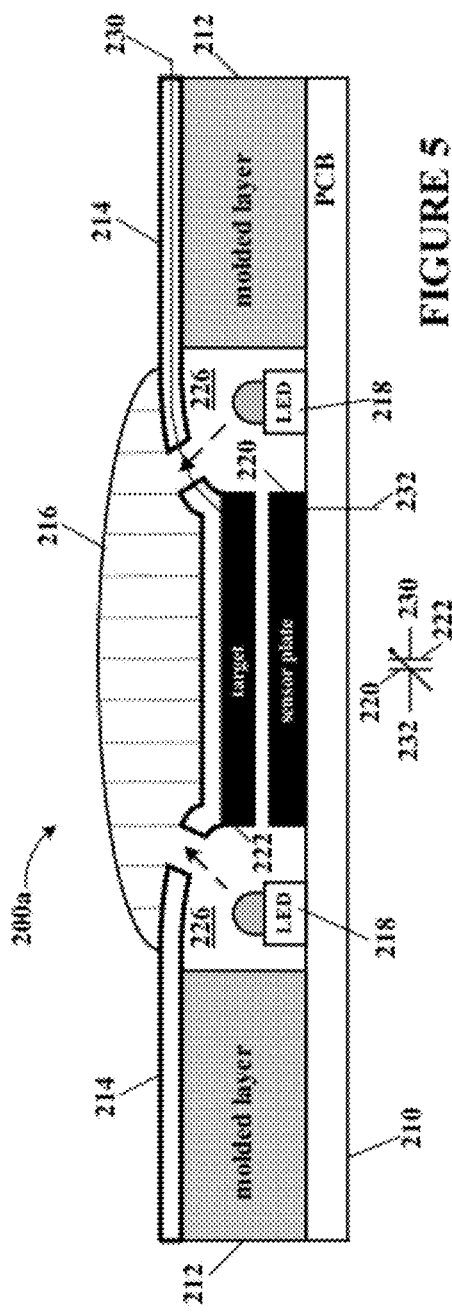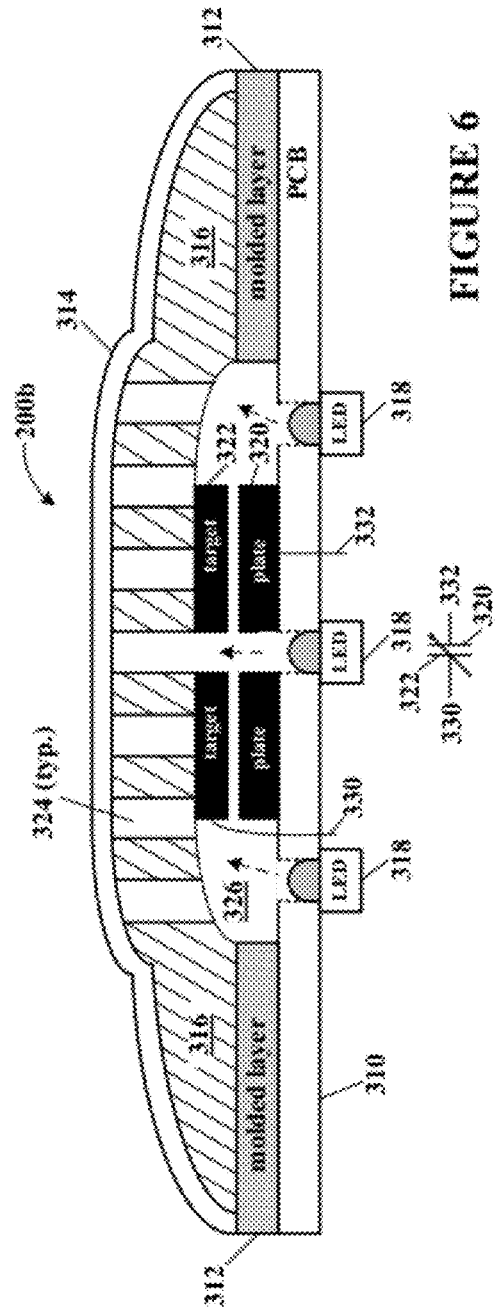

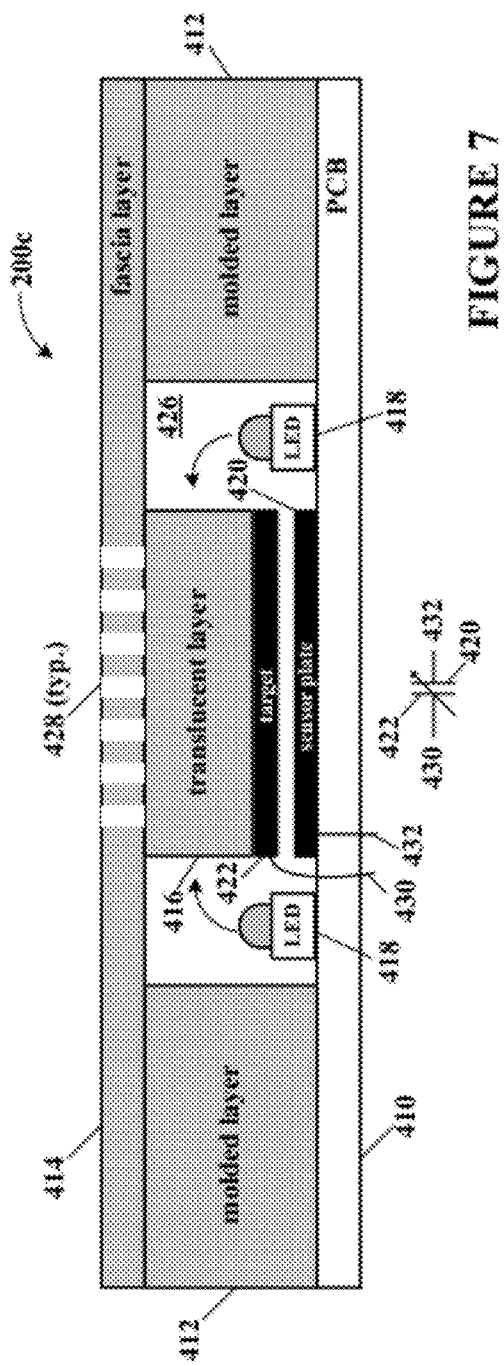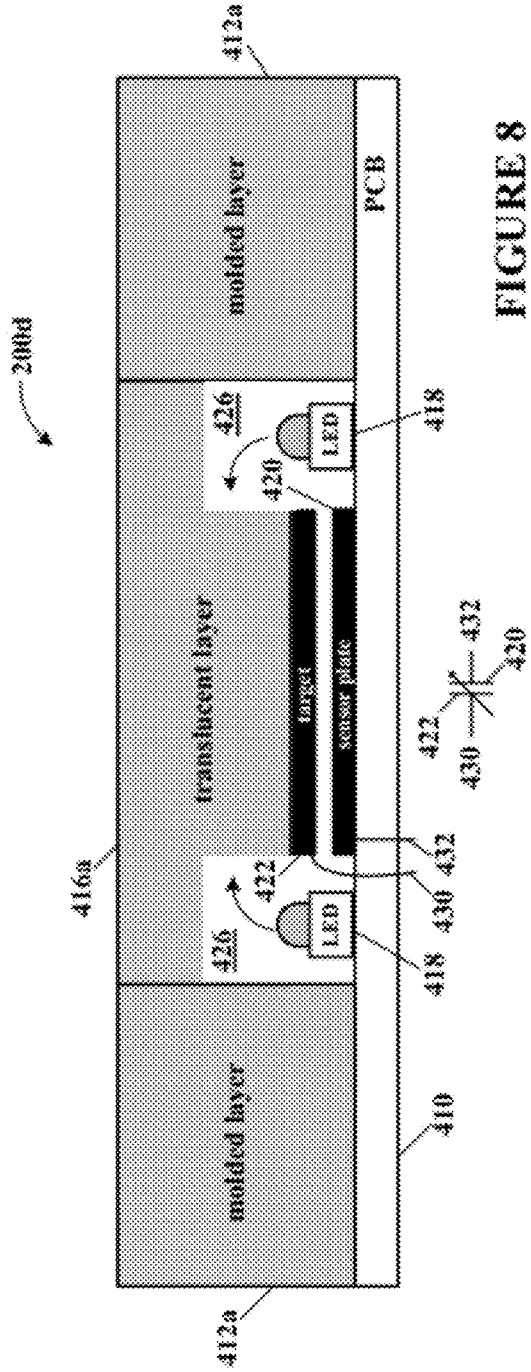

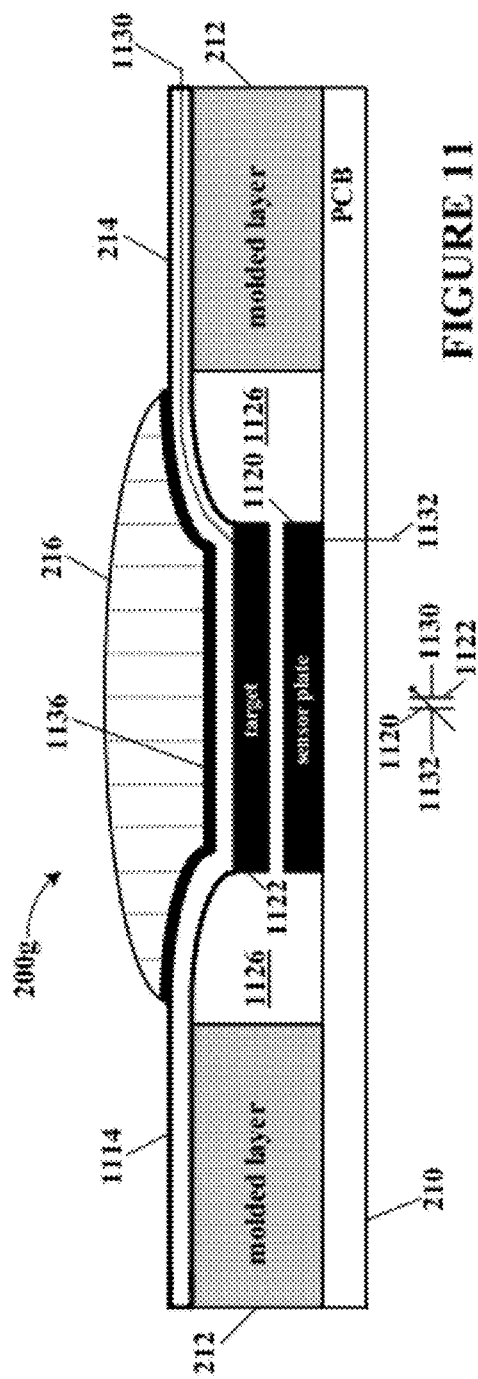
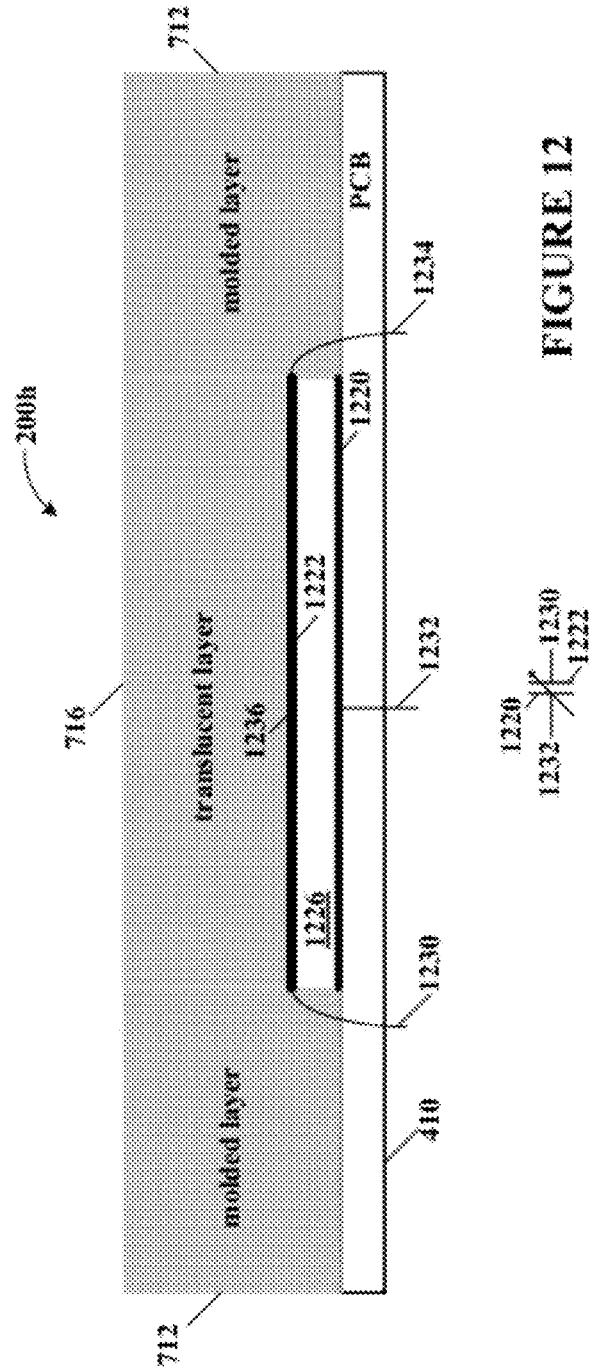

PHYSICAL FORCE CAPACITIVE TOUCH SENSORS HAVING CONDUCTIVE PLANE AND BACKLIGHTING

RELATED PATENT APPLICATIONS

This application is a continuation-in-part of and claims priority to commonly owned U.S. patent application Ser. No. 12/787,474; filed May 26, 2010 now U.S. Pat. No. 8,408,723; entitled "Backlighting Inductive Touch Buttons," by Stephen B. Porter and Keith E. Curtis; which claims priority to U.S. Provisional Patent Application Ser. No. 61/238,718; filed Sep. 1, 2009; entitled "Backlighting Inductive Touch Buttons," by Stephen B. Porter and Keith E. Curtis; and U.S. patent application Ser. No. 12/556,191; filed Sep. 9, 2009 now abandoned; entitled "Physical Force Capacitive Touch Sensor," by Keith E. Curtis and Fanie Duvenhage; which claims priority to U.S. Provisional Patent Application Ser. No. 61/108,648; filed Oct. 27, 2008; entitled "Physical Force Capacitive Touch Sensor," by Keith E. Curtis and Fanie Duvenhage; wherein all are hereby incorporated by reference herein for all purposes.

TECHNICAL FIELD

The present disclosure relates to electronic capacitive touch sensors, e.g., keys or buttons, and more particularly, to a more secure capacitive touch sensor that requires physical force on the touch sensor during activation and further shields the sensor from extraneous unwanted activation by inadvertent proximity of a user, and backlighting of the capacitive touch sensor.

BACKGROUND

Capacitive touch sensors are used as a user interface to electronic equipment, e.g., calculators, telephones, cash registers, gasoline pumps, etc. The capacitive touch sensors are activated (controls a signal indicating activation) by a change in capacitance of the capacitive touch sensor when an object, e.g., user finger tip, causes the capacitance thereof to change. Referring to FIG. 1, depicted is a prior technology capacitive touch sensor generally represented by the numeral 100. The prior technology capacitive touch sensor 100 comprises a substrate 102, a sensor element 112 and a protective covering 108, e.g., glass. When a user finger tip 110 comes in close proximity to the sensor element 112, the capacitance value of the sensor element 112 changes. This capacitance change is electronically processed (not shown) so as to generate a signal indicating activation of the capacitive touch sensor 100 by the user (only finger tip 110 thereof shown). The protective covering 108 may be used to protect the sensor element 112 and for marking of the sensor 100.

Problems exist with proper operation of the sensor 100 that may be caused by water, oil, mud, and/or food products, e.g., ketchup and mustard, either false triggering activation or inhibiting a desired activation thereof. Also problems exist when metallic objects (not shown) come in near proximity of the sensor element 112 and cause an undesired activation thereof. When there are a plurality of sensors 100 arranged in a matrix, e.g., numeric and/or pictorial arrangement, activation of an intended one of the sensors 100 may cause a neighbor sensor(s) 100 to undesirably actuate because of the close proximity of the user finger tip 110, or other portion of the user hand (not shown). This multiple activation of more then one sensor 100 may be caused when touching the intended sensor 100 and a portion of the user's hand also is sufficiently close to adjacent neighbor sensors 100 for activation thereof.

Each capacitive touch sensor key or button comprises a capacitive sensor on a substrate, a thin dielectric spacer layer over the capacitive touch sensor, and a deformable metal target layer (e.g., key or button) over the thin dielectric spacer layer. When the deformable metal target layer is depressed, the capacitance value of the capacitive sensor changes (increases). This change in capacitance value is detected and is used to indicate that the key or button has been pressed. A problem exists however in that the deformable metal target layer is light opaque and therefore precludes backlighting thereof. Existing published solutions for capacitive touch sensor designs are mechanically very thin. They rely on simple flat spacer layers less than about 50 micrometers thick and continuous conductive metal sheets for targets that do not allow light to pass therethrough.

SUMMARY

The aforementioned problems are solved, and other and further benefits achieved by the capacitive touch sensors disclosed herein.

According to an embodiment, a physical force capacitive touch sensor may comprise: a substrate; a capacitive sensor element on a face of the substrate; a deformable spacer covering the capacitive sensor element; a substantially non-deformable spacer surrounding the capacitive sensor element and the deformable spacer; and a electrically conductive plane covering the deformable spacer and the substantially non-deformable spacer, wherein when a mechanical force is applied to the electrically conductive plane biased toward the capacitive sensor element, the capacitive sensor element changes capacitance.

According to another embodiment, a user interface having a plurality of physical force capacitive touch sensors may comprise: a substrate; a plurality of capacitive sensor elements on a face of the substrate; deformable spacers covering the plurality of capacitive sensor elements; a substantially non-deformable spacer surrounding the plurality of capacitive sensor elements and the deformable spacers; and a electrically conductive plane covering the deformable spacers and the substantially non-deformable spacer, wherein when a mechanical force is applied to the electrically conductive plane biased toward a one of the plurality of capacitive sensor elements, the one of the plurality of capacitive sensor elements changes capacitance.

According to an embodiment a backlit capacitive touch sensor key may comprise: a substrate; a capacitive sensor plate on the substrate; a light source; a spacer layer on the substrate, wherein the spacer layer has an opening that surrounds the capacitive sensor plate and the light source; a over-layer having at least one opening therein to allow light to pass therethrough from the light source, the over-layer is attached to the spacer layer and forms a light transmission cavity between the substrate and the over-layer; an over-mold button attached to a side of the over-layer opposite the light transmission cavity, the over-mold button being light transmissive; and a metal target attached on a face of the over-layer proximate to the capacitive sensor plate, wherein when the over-mold button and the metal target are biased toward the capacitive sensor plate, a capacitance value of the capacitive sensor plate changes. According to a further embodiment, the light source is at least one light emitting diode (LED). According to a further embodiment, the light source is an organic light emitting diode (OLED) layer. According to a further embodiment, the light source is an electroluminescence (EL) layer. According to a further embodiment, the over-layer is nonmetallic. According to a further embodiment, the substrate is a printed circuit board.

According to another embodiment, a backlit capacitive touch sensor key may comprise: a substrate; a capacitive sensor plate on the substrate; a light source; a spacer layer on the substrate, wherein the spacer layer has an opening that surrounds the capacitive sensor plate and the light source; a flexible light translucent layer; a metal target attached to a face of the flexible light translucent layer proximate to the capacitive sensor plate, wherein the metal target has opening therein to allow light to pass therethrough; the flexible light translucent layer is attached to the spacer layer over the capacitive sensor plate and light source, wherein a light transmission cavity is formed between the substrate and the flexible light translucent layer and metal target; whereby when the flexible light translucent layer and metal target are biased toward the capacitive sensor plate, a capacitance value of the capacitive sensor plate changes.

According to a further embodiment, the light source is at least one light emitting diode (LED). According to a further embodiment, the light source is an organic light emitting diode (OLED) layer. According to a further embodiment, the light source is an electroluminescence (EL) layer. According to a further embodiment, the metal target is light opaque and has at least one opening therein for light from the light source to pass therethrough. According to a further embodiment, a flexible over-layer over the flexible light translucent layer may be added. According to a further embodiment, the flexible over-layer is made of light transmissive material. According to a further embodiment, the flexible over-layer is made of light opaque material and has opening therein for light from the light source to pass therethrough. According to a further embodiment, the flexible over-layer is metal. According to a further embodiment, the flexible over-layer is nonmetallic. According to a further embodiment, the substrate is a printed circuit board.

According to yet another embodiment, a backlit capacitive touch sensor key may comprise: a substrate; a capacitive sensor plate on the substrate; a light source arranged to shine through the capacitive sensor plate; an opaque layer on the substrate, wherein the opaque layer has an opening that surrounds the capacitive sensor plate; a flexible light translucent layer attached to the opaque layer, the flexible light translucent layer is over the capacitive sensor plate, wherein a light transmission cavity is formed between the substrate and the flexible light translucent layer; and an electrically conductive and light translucent coating on a face of the flexible light translucent layer proximate to the capacitive sensor plate, wherein when the flexible light translucent layer is biased toward the capacitive sensor plate, a capacitance value of the capacitive sensor plate changes.

According to a further embodiment, the light source may be at least one light emitting diode (LED). According to a further embodiment, the light source is an organic light emitting diode (OLED) layer. According to a further embodiment, the light source is an electroluminescence (EL) layer. According to a further embodiment, the electrically conductive and light translucent coating may be indium tin oxide (ITO). According to a further embodiment, the electrically conductive and light translucent coating may be antimony tin oxide (ATO). According to a further embodiment, the electrically conductive and light translucent coating may be graphene.

According to a further embodiment, the substrate is a printed circuit board. According to a further embodiment, the substrate may be light translucent. According to a further embodiment, the light translucent substrate comprises glass. According to a further embodiment, the light translucent substrate may comprise plastic. According to a further embodiment, the capacitive sensor plate may comprise an electrically conductive and light translucent coating on a face of the light translucent substrate. According to a further embodiment, the electrically conductive and light translucent coating on the face of the light translucent substrate may be selected from the group consisting of indium tin oxide (ITO), antimony tin oxide (ATO) and graphene.

BRIEF DESCRIPTION OF THE DRAWINGS

A more complete understanding of the present disclosure thereof may be acquired by referring to the following description taken in conjunction with the accompanying drawings wherein:

FIG. 5 illustrates a schematic elevational view of a backlighted capacitive touch key comprising a light transmissive button in combination with an over-layer having holes therein for light to pass therethrough, according to a specific example embodiment of this disclosure;

FIG. 6 illustrates a schematic elevational view of a backlighted capacitive touch key comprising a light transmissive layer and a protective over-layer adapted for light to pass therethrough, according to another specific example embodiment of this disclosure;

FIG. 7 illustrates a schematic elevational view of a backlighted capacitive touch key comprising a flat fascia adapted for light to pass therethrough, according to yet another specific example embodiment of this disclosure;

FIG. 8 illustrates a schematic elevational view of a backlighted capacitive touch key comprising a translucent layer for light to pass therethrough with a target attached thereto, according to still another specific example embodiment of this disclosure;

FIGS. 11 and 12 illustrate schematic elevational views of capacitive touch keys having a light source layer over the capacitive touch key and a translucent layer over the light source layer, according to still other specific example embodiments of this disclosure.

Figure 1:
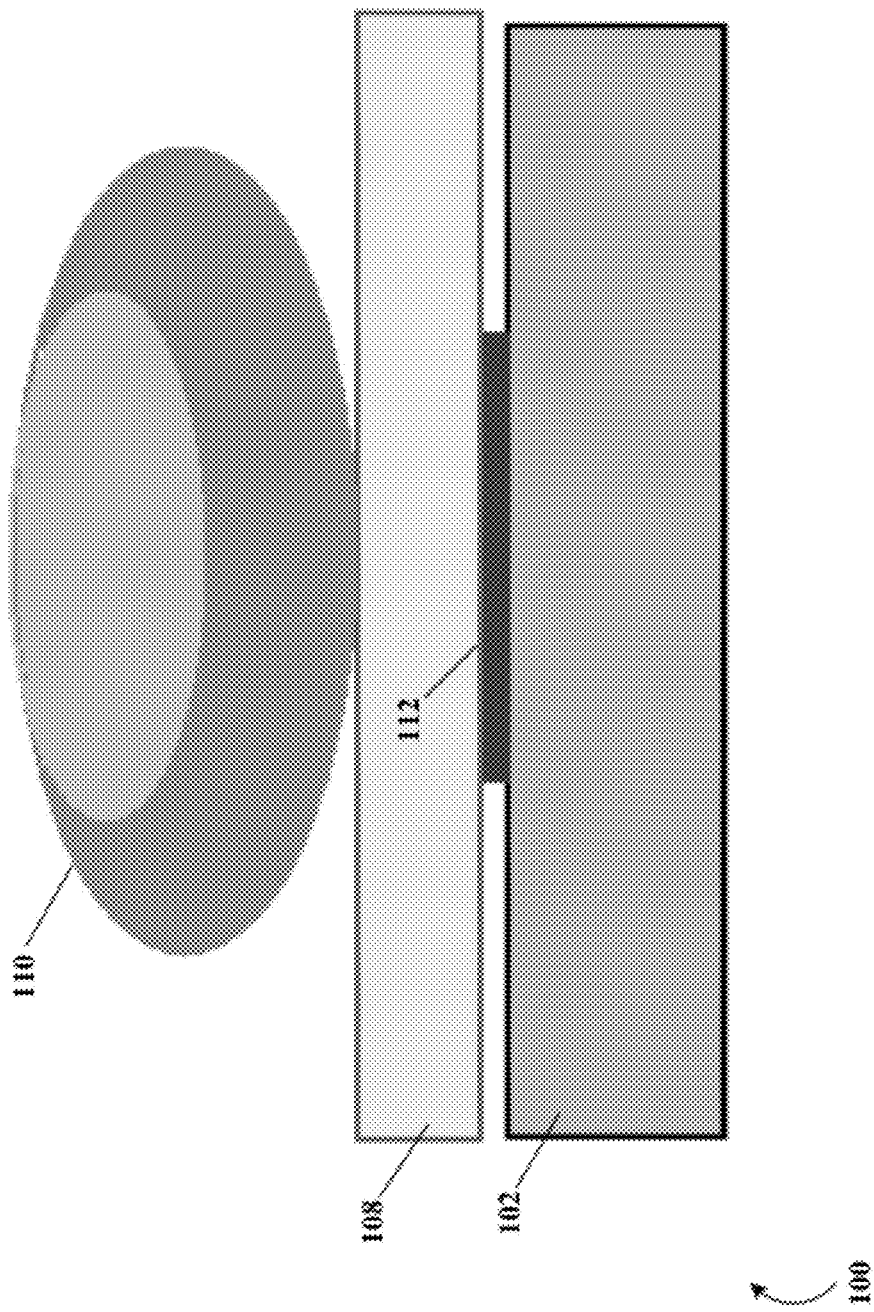
FIG. 1 is a schematic side view of a cross section of a prior technology capacitive touch sensor.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a capacitive touch sensor comprises a capacitive sensor element on a substrate, a physically deformable electrically insulating spacer over the capacitive sensor element, and a conductive plane over the physically deformable electrically insulating spacer that is substantially parallel to the capacitive sensor element. The conductive plane is connected to a power supply common and/or grounded to form a capacitor with the capacitive sensor element and for improved shielding of the capacitive sensor element from electrostatic and electromagnetic disturbances, and false triggering thereof. A protective cover may be placed over the conductive plane to act as an environmental seal for improved physical and weather protection, but is not essential to operation of the capacitive touch sensor.

When the user presses down onto the approximate center of a target (e.g., alpha/numeric and/or graphical) on the conductive plan of the capacitive touch sensor, the distance between the capacitive sensor element and the conductive plane is reduced, thus changing the capacitance of the capacitive sensor element. A capacitance change detection circuit monitors the capacitance value of the capacitive sensor element, and when the capacitance value changes (e.g., increases) a sensor activation signal is generated.

The capacitive touch sensor, according to the teachings of this disclosure, is substantially immune to false triggering caused by a user in close proximity to the sensor target because a correct area of the conductive plane must be slightly deformed in order for the capacitance of the capacitive sensor element to change. In addition, stray metallic objects will not substantially affect the capacitance of the capacitive sensor element for the same reason. Furthermore the assembly of the capacitive touch sensor can be sealed with the physically deformable electrically insulated spacer and may thus be substantially immune to liquid contamination thereof.

A molded spacer layer and a discrete conductive metal disk may be used for a capacitive target, according to the teachings of this disclosure. By using either reverser mount or side illuminating LED(s) with a suspended metal target, capacitive touch sensor keys or buttons may be backlit. Backlighting of capacitive touch sensor keys or buttons is especially desirable for use in appliances, automotive controls, consumer products such as television set top box converters for cable or satellite television reception, security entry pads, intercom buttons, computers, industrial control panels, etc. Backlighting of the keys or buttons may be used to indicate that the key or button has been pressed, e.g., visual feedback, and/or improved visibility under poor lighting conditions.

There are several things that are needed to complete backlighting for capacitive touch buttons. Capacitive touch buttons in most cases require that the metal fascia be the target, but according to the teachings of this disclosure it would be moved away from the capacitive sensor plate to the point where it will not work as the target for changing the capacitance value of the touch sensor. To counteract this, a suspended target proximate to the capacitive sensor plate is used. By configuring the lighted capacitive touch buttons as such, height may be added to the capacitive touch panel design that will allow placement of light emitting diodes (LEDs) on the top and/or bottom side(s) of the circuit board comprising the capacitive sensor plate.

By moving the front button layer farther from the substrate, e.g., capacitive touch printed circuit board (PCB), a molded plastic layer(s) may be used for light to pass therethrough and thereby provides for backlighting of the capacitive touch sensor buttons. A metallic target layer is attached and/or molded on the plastic layer proximate to the capacitive sensor plate. As this metallic target layer moves closer to the capacitive sensor plate when the button is depressed, the capacitance of the capacitive sensor thereby changes (increases) and is detected. The metallic target layer may also be used as a shield to prevent or reduce hot (bright) spots in the lighting of the capacitive touch sensor button.

The material that holds the suspended metallic target may be translucent and function as a light pipe for transmission of light from a light source, e.g., light emitting diodes (LEDs). This translucent material may also function as a seal for the holes that may now be placed in the metal cover to allow light to pass therethrough. The material that is used as the spacer surrounding the capacitive sensor plate may be of a non-translucent material so as to prevent bleeding of light from one adjacent key or button to the next.

The light source LEDs do not have to be mounted on the top side of the circuit board, as they can be mounted elsewhere as needed. Also the top layer does not have to be flat or even metal, and it may be curved or use an over-mold process for sealing of the button.

Referring now to the drawings, the details of example embodiments are schematically illustrated. Like elements in the drawings will be represented by like numbers, and similar elements will be represented by like numbers with a different lower case letter suffix.

Figure 2:
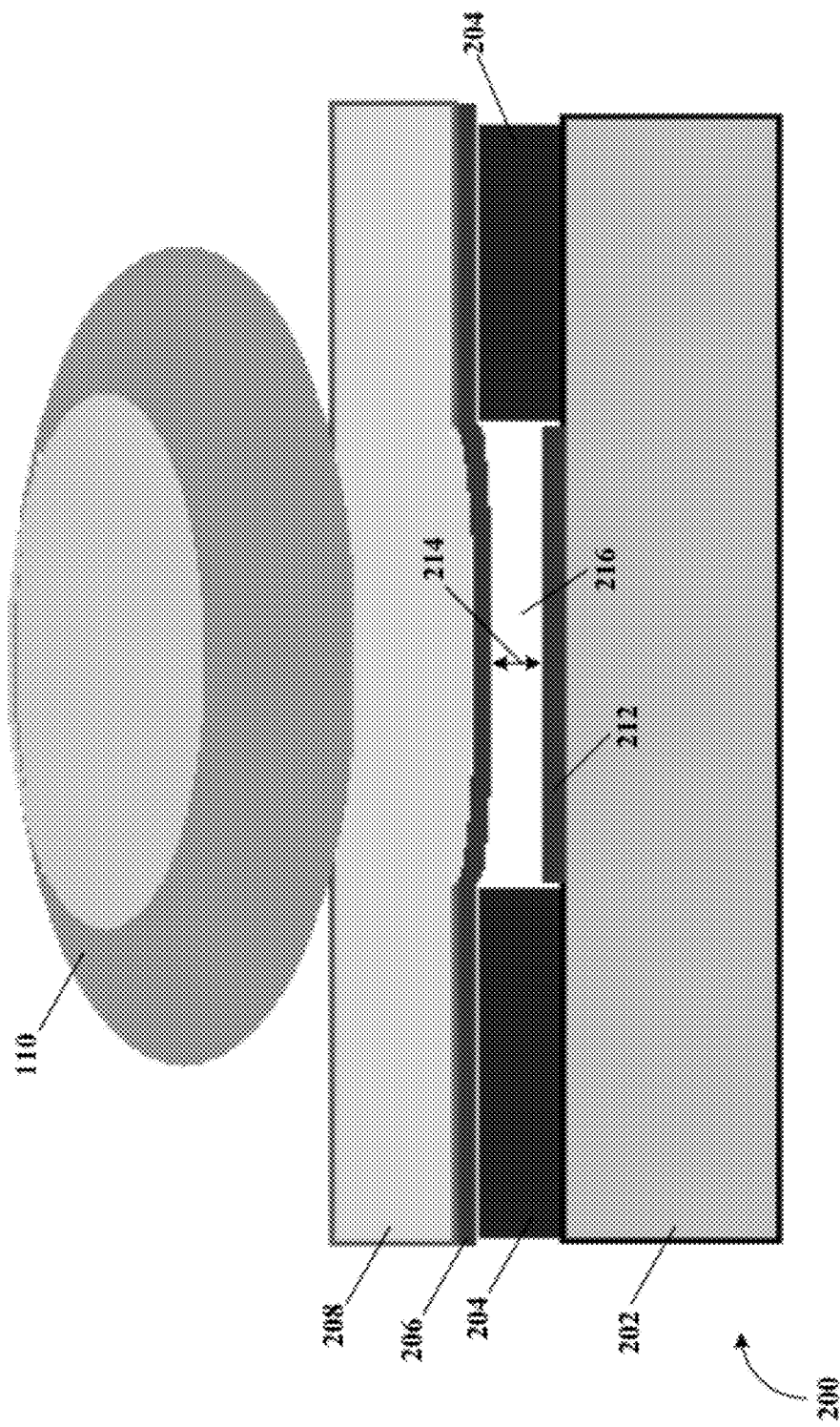
FIG. 2 is a schematic side view of a cross section of a capacitive touch sensor, according to a specific example embodiment of this disclosure.

Referring to FIG. 2, depicted is a schematic side view of a cross section of a capacitive touch sensor, according to a specific example embodiment of this disclosure. The capacitive touch sensor, generally represented by the numeral 200, comprises a substrate 202, a capacitive sensor element 212, a deformable spacer 216, non-deformable spacers 204, a conductive plane 206 and a protective cover 208. The conductive plane 206 is connected to a power supply common and/or grounded (not shown) to form a capacitor with the capacitive sensor element 212 and for improved shielding of the capacitive sensor element 212 from electrostatic disturbances and false triggering thereof. The protective cover 208 may be used as an environmental seal for improved physical and weather protection, but is not essential to operation of the capacitive touch sensor 200.

The conductive plane 206 and protective cover 208 are physically deformable over the deformable spacer 216 so that when a user finger 110 presses down onto the approximate center of a target (e.g., alpha/numeric and/or graphical see FIG. 3) on the conductive plan 206 of the capacitive touch sensor 200, the distance 214 between the capacitive sensor element 212 and the conductive plane 206 is reduced, thus changing the capacitance of the capacitive sensor element 212. A capacitance change detection circuit (not shown) monitors the capacitance value of the capacitive sensor element 212, and when the capacitance value changes (e.g., increases) a sensor activation signal is generated (not shown).

The capacitive touch sensor 200 is substantially immune to false triggering caused by a user in close proximity to the sensor target because a correct area of the conductive plane 206 must be slightly deformed in order for the capacitance of the capacitive sensor element 212 to change, e.g., requires an actuation force from the user finger 110. In addition, stray metallic objects will not substantially affect the capacitance of the capacitive sensor element 212 for the same reason. Furthermore the assembly of the capacitive touch sensor 200 can be sealed with the physically deformable electrically insulated spacer 216 and may thus be substantially immune to liquid contamination thereof. Also since the non-deformable spacers 204 surround the capacitive sensor element 212 and the physically deformable electrically insulated spacer 216, adjacent capacitive sensor elements 212 (see FIG. 3) will not be affected, e.g., no capacitance change because areas of conductive plane 206 over adjacent capacitive sensor elements 212 will not be deformed.

The capacitive sensor element 212 is electrically conductive and may be comprised of metal such as, for example but not limited to, copper, aluminum, silver, gold, tin, and/or any combination thereof, plated or otherwise. The capacitive sensor element 212 may also be comprised of non-metallic conductive material. The substrate 202 and capacitive sensor element 212 may be, for example but are not limited to, a printed circuit board having conductive metal areas etched thereon, a ceramic substrate with conductive metal areas plated thereon, etc.

Figure 3:
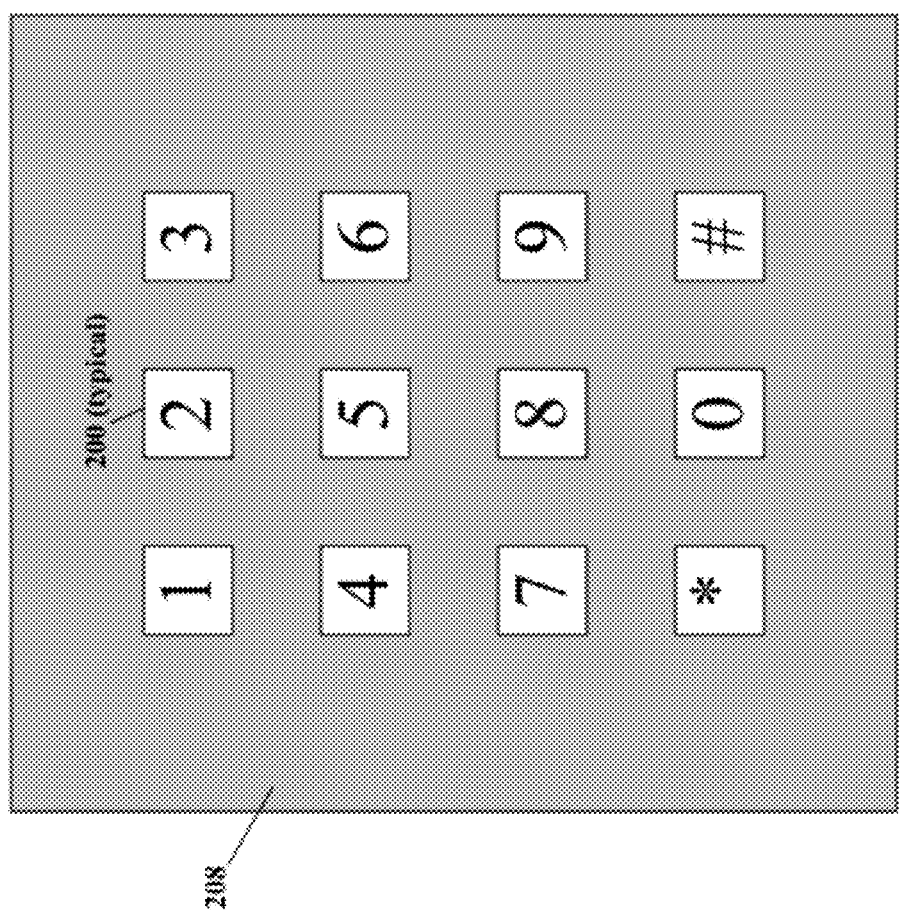
FIG. 3 is a schematic plan view of a user interface arranged as data input matrix and having a plurality of capacitive touch sensors as shown in FIG. 2.

Referring to FIG. 3, depicted is a schematic plan view of a user interface arranged as data input matrix and having a plurality of capacitive touch sensors as shown in FIG. 2. A plurality of capacitive touch sensors 200 are arranged in a matrix and have alpha-numeric representations indicating the functions thereof. When a mechanical force is applied any one of the capacitive touch sensors 200, the area directly over the capacitive sensor element 212 of that one capacitive touch sensor 200 will be deformed toward the direction of the mechanical force, bring the conductive plane 206 closer to the capacitive sensor element 212 and thereby changing the capacitance thereof.

Figure 4:
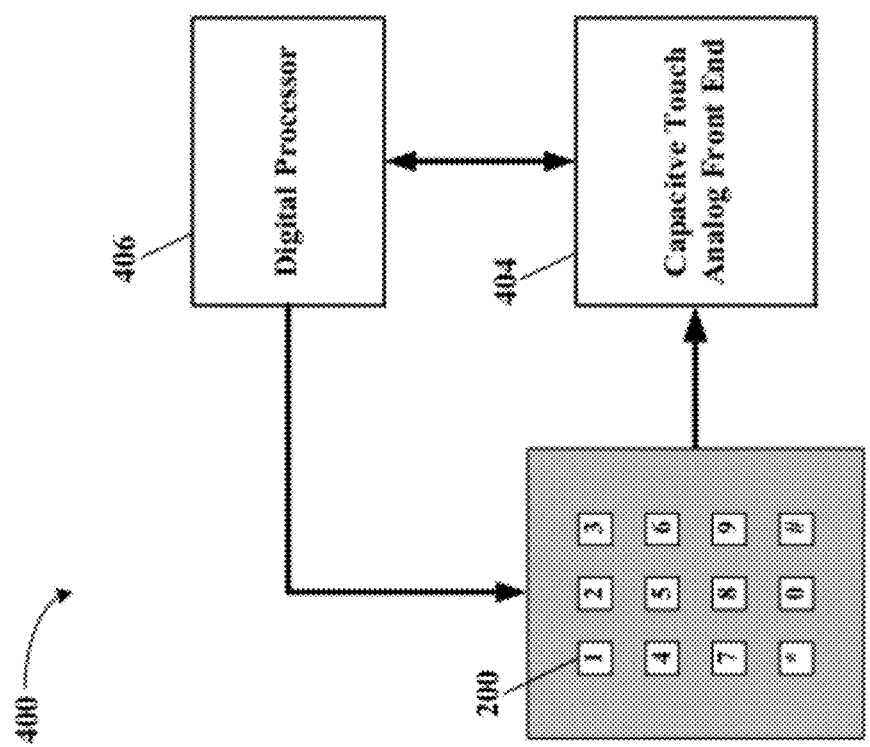
FIG. 4 illustrates a schematic block diagram of an electronic system having a capacitive touch keypad, a capacitive touch analog front end and a digital processor, according to the teachings of this disclosure.

Referring to FIG. 4, depicted is a schematic block diagram of an electronic system having a capacitive touch keypad, a capacitive touch analog front end and a digital processor, according to the teachings of this disclosure. A digital processor 406, e.g., a microprocessor, microcomputer, digital signal processor (DSP), application specific integrated circuit (ASIC), programmable logic array (PLA), etc., is coupled to a capacitive touch analog front end (AFE) 404 and a matrix of capacitive touch sensor keys 200, e.g., pushbuttons, levers, toggles, targets, handles, knobs, etc. The digital processor 406 and AFE 404 may be part of a mixed signal (analog and digital circuits) integrated circuit device.

The capacitive touch AFE 404 facilitates, with a single low-cost integrated circuit device, all active functions used in determining when there is actuation of capacitive sensors, e.g., by pressing and deflecting a target key that changes the capacitance value of an associated capacitive sensor. The capacitive touch AFE 404 measures the capacitance value of each sensor of the matrix of capacitive touch sensor keys 200 and converts the capacitance values into respective analog direct current (dc) voltages that are read and converted into digital values with an analog-to-digital converter (ADC) (not shown) and sent to the digital processor 406.

The digital processor 406 supplies clock and control functions to the capacitive touch AFE 404, reads the analog voltage detector output of the capacitive touch AFE 404, and selects each key of the matrix of capacitive touch sensor keys 200. When actuation of a key of the matrix of capacitive touch sensor keys 200 is determined, the digital processor 406 will take an appropriate action. According to the teachings of this disclosure, each key (touch buttons) of the matrix of capacitive touch sensor keys 200 is illuminated, as more fully described hereinafter.

Referring to FIG. 5, depicted is a schematic elevational view of a back-lighted capacitive touch key comprising a light transmissive button in combination with an over-layer having holes therein for light to pass therethrough, according to a specific example embodiment of this disclosure. A back-lighted capacitive touch key 200*a* comprises a substrate 210, e.g., printed circuit board (PCB); a capacitive sensor plate 220, a light source, e.g., light emitting diodes (LEDs) 218; a non-translucent (opaque) molded spacer layer 212 surrounds the capacitive sensor plate 220 and LEDs 218, an over-layer 214 having openings therein for light from the LEDs 218 to pass therethrough, and an over-mold button 216 that is translucent for illumination thereof by the light from the LEDs 218. In addition, if the over-layer 214 is non-metallic then a metallic target 222 is disposed on a surface of the over-layer 214 proximate to the capacitive sensor plate 220. A metallic over-layer 214 may be for example, but is not limited to, aluminum, steel, stainless steel, copper, titanium, etc. A non-metallic over-layer 214 may be for example, but is not limited to, plastic, Teflon, polyamide, etc. The sensor plate 220 and metallic target 222 form a capacitor having a capacitance that will increase when the metallic target 222 is forced closer to the sensor plate 220 by a force (touch) on the over-mold button 216. The capacitor formed thereby may be connected to the capacitive touch AFE 404 with conductors 230 and 232.

The molded spacer layer 212 surrounding the capacitive sensor plate 220 and LEDs 218 is substantially non-translucent (opaque) so that light does not bleed over to another adjacent back-lighted capacitive touch key (not shown). The LEDs 218 (light source) may be mounted on top of the substrate 210, and inside of a cavity 226 formed by the substrate 210, the molded spacer layer 212 and the over-layer 214. The LEDs 218 may also be mounted in the substrate 210 or on the opposite side thereof (e.g., LED 318 of FIG. 3). LEDs 218 may be on either side and/or inside (see FIG. 3) of the capacitive sensor plate 220.

The over-mold button 216 is flexible wherein when pushed (actuated) by an external force, e.g., push from a finger, the over-layer 214 portion over the capacitive sensor plate 220 moves closer thereto and thereby changes (increases) the capacitance thereof. If the over-layer 214 is non-metallic and does not affect the capacitance of the capacitive sensor plate 220, then a metallic target 222 may be attached to the over-layer 214 proximate to the capacitive sensor plate 220.

The capacitive touch AFE 404 (FIG. 4) detects this change in capacitance of the sensor plate 220 and indicates this event to the digital processor 406 for appropriate action to be taken. For example, but not limited to, a change in intensity and/or color of the light from the LEDs 218 may indicate successful actuation of this specific capacitive touch sensor key 200*a*. It is contemplated and within the scope of this disclosure that the over-layer 214 portion over the capacitive sensor plate 220 and/or the target 222 may be any type of material that affects the capacitance value of the capacitive sensor plate 220 when there is a change in distance therebetween.

Referring to FIG. 6, depicted is a schematic elevational view of a back-lighted capacitive touch key comprising a light transmissive layer and a protective over-layer adapted for light to pass therethrough, according to another specific example embodiment of this disclosure. A back-lighted capacitive touch key 200*b* comprises a substrate 310, e.g., a printed circuit board (PCB); a capacitive sensor plate 320, a light source, e.g., light emitting diodes (LEDs) 318; a non-translucent (opaque) molded spacer layer 312 surrounds the capacitive sensor plate 320 and LEDs 318, a light transmissive layer 316, a metallic target 322 attached to the layer 316 and proximate to the capacitive sensor plate 320, and an over-layer 314 that a portion thereof is either light transmissive or has openings 324 therein for light from the LEDs 318 to pass therethrough. The capacitor formed thereby may be connected to the capacitive touch AFE 404 with conductors 330 and 332.

The molded spacer layer 312 surrounding the capacitive sensor plate 320 and LEDs 318 is substantially non-translucent (opaque) so that light does not bleed over to another adjacent back-lighted capacitive touch key (not shown). The LEDs 318 (light source) may be mounted on top of the substrate 310 (e.g., LED 218 of FIG. 5) and inside of a cavity 326 formed by the substrate 310, the molded spacer layer 312 and the light transmissive layer 316. The LEDs 318 may also be mounted in the substrate 310 or on the opposite side thereof. LEDs 318 may be on either side and/or inside of the capacitive sensor plate 320.

The light transmissive layer 316 may be flexible wherein when pushed (actuated) by an external force, e.g., push from a finger, the light transmissive layer 316 portion over capacitive sensor plate 320 moves closer thereto and thereby changes the capacitance thereof. If the light transmissive layer 316 is not made of a flexible and/or light transmissive material then openings or gaps 324 may be disposed within a portion of the light transmissive layer 316 for light from the LEDs 318 to pass therethrough.

The over-layer 314 may be used for protection from physical abuse and/or harmful water and/or chemical infiltration. The over-layer 314 may comprise a thin metal layer, e.g., aluminum, steel, stainless steel, copper, titanium, etc. or a non-metallic layer, e.g., plastic, Teflon, polyamide, etc. If the material of the over-layer 314 is not light transmissive then opening may be placed therein (not shown) for light transmission therethrough.

If the light transmissive layer 316 is non-metallic and does not affect the capacitance of the capacitive sensor plate 320, then a metallic target 322 may be attached to the light transmissive layer 316 proximate to the capacitive sensor plate 320.

The capacitive touch AFE 404 (FIG. 4) detects a change in capacitance of the sensor plate 320 and indicates this event to the digital processor 406 for appropriate action to be taken. For example, but not limited to, a change in intensity and/or color of the light from the LEDs 318 may indicate successful actuation of this specific capacitive touch sensor key 200b. It is contemplated and within the scope of this disclosure that the light transmissive layer 316 and/or the target 322 over the capacitive sensor plate 320 may be any type of material that affects the capacitance value of the capacitive sensor plate 320 when there is a change in distance therebetween. The target 322 may also provide light shielding an light diffusion from the light source, e.g., LED 318, so as to prevent light intensity "hot spots" in the back-lighted capacitive touch key 200b.

Referring to FIG. 4, depicted is a schematic elevational view of a back-lighted capacitive touch key comprising a flat fascia adapted for light to pass therethrough, according to yet another specific example embodiment of this disclosure. A back-lighted capacitive touch key 200c comprises a substrate 410, e.g., a printed circuit board (PCB); a capacitive sensor plate 420, a light source, e.g., light emitting diodes (LEDs) 418; a non-translucent (opaque) molded spacer layer 412 surrounds the capacitive sensor plate 420 and LEDs 418, a light transmissive (translucent) layer 416, a metallic target 422 attached to a face of the layer 416 and proximate to the capacitive sensor plate 420, and an over-layer fascia 414 that a portion thereof is either light transmissive or has openings 428 therein for light from the light transmissive layer 416 to pass therethrough. The capacitor formed thereby may be connected to the capacitive touch AFE 404 with conductors 430 and 432.

The over-layer fascia 414 may be substantially flat and attached to the non-translucent (opaque) molded spacer layer 412 for support thereof. The light transmissive layer 416 is attached to the over-layer fascia 414 and in cooperation therewith moves the metallic target 422 closer to the capacitive sensor plate 420 when a force is applied to the over-layer fascia 414 proximate to the light transmissive layer 416. The light transmissive layer 416 serves as a light pipe for illumination of an information area of the over-layer fascia 414. The material of the over-layer fascia 414 may comprise metal or be nonmetallic as desired, and if this material is opaque (non-light transmissive), openings 428 therein may be provided for light to pass therethrough.

The molded spacer layer 412 surrounding the capacitive sensor plate 420 and LEDs 418 is substantially non-translucent (opaque) so that light does not bleed over to another adjacent back-lighted capacitive touch key (not shown). The LEDs 418 (light source) may be mounted on top of the substrate 410 (e.g., LED 218 of FIG. 5) and inside of a cavity 426 formed by the substrate 410, the molded spacer layer 412 and the over-layer fascia 414. The LEDs 418 may also be mounted in the substrate 410, (see, FIG. 9 LEDs 418). LEDs 418 may be on either side and/or inside of the capacitive sensor plate 420. The over-layer fascia 414 may be used for protection from physical abuse and/or harmful water and/or chemical infiltration. The over-layer fascia 414 may comprise a thin metal layer such as for example, but is not limited to, aluminum, steel, stainless steel, copper, titanium, etc., or a non-metallic layer such as for example, but is not limited to, plastic, Teflon, polyamide, etc.

The capacitive touch AFE 404 (FIG. 4) detects a change in capacitance of the sensor plate 420 and indicates this event to the digital processor 406 for appropriate action to be taken. For example, but not limited to, a change in intensity and/or color of the light from the LEDs 418 may indicate successful actuation of this specific capacitive touch sensor key 200c. It is contemplated and within the scope of this disclosure that the light transmissive layer 416 and/or the target 422 over the capacitive sensor plate 420 may be any type of material that affects the capacitance value of the capacitive sensor plate 420 when there is a change in distance therebetween.

Referring to FIG. 8, depicted is a schematic elevational view of a back-lighted capacitive touch key comprising a translucent layer for light to pass therethrough with a target attached thereto, according to still another specific example embodiment of this disclosure. A back-lighted capacitive touch key 200d comprises a substrate 410, e.g., a printed circuit board (PCB); a capacitive sensor plate 420, a light source, e.g., light emitting diodes (LEDs) 418; a non-translucent (opaque) molded spacer layer 412a surrounds the capacitive sensor plate 420 and LEDs 418, a light transmissive (translucent) layer 416a, and a metallic target 422 attached to a face of the layer 416a and proximate to the capacitive sensor plate 420. The capacitor formed thereby may be connected to the capacitive touch AFE 404 with conductors 430 and 432.

The molded spacer layer 412a surrounding the capacitive sensor plate 420 and LEDs 418 is substantially non-translucent (opaque) so that light does not bleed over to another adjacent back-lighted capacitive touch key (not shown). The LEDs 418 (light source) may be mounted on top of the substrate 410 (e.g., LED 218 of FIG. 2) and inside of a cavity 426 formed by the substrate 410, the molded spacer layer 412a and the layer 416a. The LEDs 418 may also be mounted in the substrate 410, (see, FIG. 6 LEDs 418). LEDs 418 may be on either side and/or inside of the capacitive sensor plate 420. The layer 416a may also be used for protection from physical abuse and/or harmful water and/or chemical infiltration.

The capacitive touch AFE 404 (FIG. 4) detects a change in capacitance of the sensor plate 420 and indicates this event to the digital processor 406 for appropriate action to be taken. For example, but not limited to, a change in intensity and/or color of the light from the LEDs 418 may indicate successful actuation of this specific capacitive touch sensor key 200d. It is contemplated and within the scope of this disclosure that the light transmissive layer 416a and/or the target 422 over the capacitive sensor plate 420 may be any type of material that affects the capacitance value of the capacitive sensor plate 420 when there is a change in distance therebetween.

Figure 9:
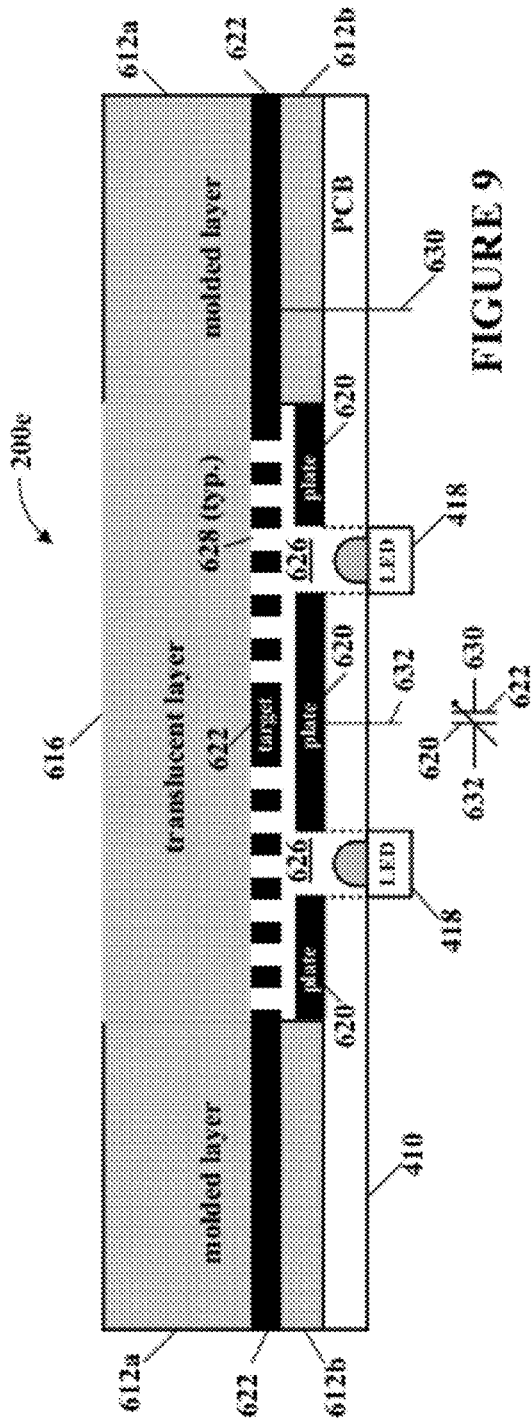
FIG. 9 illustrates a schematic elevational view of a backlighted capacitive touch key comprising a translucent layer with target attached thereto, both adapted for light to pass therethrough, according to another specific example embodiment of this disclosure.

Referring to FIG. 9, depicted is a schematic elevational view of a back-lighted capacitive touch key comprising a translucent layer with target attached thereto, both adapted for light to pass therethrough, according to another specific example embodiment of this disclosure. A back-lighted capacitive touch key 200e comprises a substrate 410, e.g., a printed circuit board (PCB); a capacitive sensor plate 620, a light source, e.g., light emitting diodes (LEDs) 418; non-translucent (opaque) molded spacer layers 612a and 612b surround the capacitive sensor plate 620 and LEDs 418, a light transmissive (translucent) layer 616, and a metallic target layer 622 attached to a face of the layer 616, between the molded spacer layers 612a and 612b, and proximate to the capacitive sensor plate 620. The capacitor formed thereby may be connected to the capacitive touch AFE 404 with conductors 630 and 632.

The molded spacer layers 612a and 612b surrounding the capacitive sensor plate 620 and LEDs 418 is substantially non-translucent (opaque) so that light does not bleed over to another adjacent back-lighted capacitive touch key (not shown). The LEDs 418 (light source) may be mounted on top of the substrate 410 (e.g., LED 218 of FIG. 5) and inside of a cavity 626 formed by the substrate 410, the molded spacer layer 612b and the metallic target layer 622. The LEDs 418 may also be mounted in the substrate 410 as shown. LEDs 418 may be on either side and/or inside of the capacitive sensor plate 620. The metallic target layer 622 comprises light transmissive openings 628 for light from the LEDs 418 to pass through to the light transmissive (translucent) layer 616. The layer 616 may also be used for protection from physical abuse and/or harmful water and/or chemical infiltration.

The capacitive touch AFE 404 (FIG. 4) detects a change in capacitance of the sensor plate 620 and indicates this event to the digital processor 406 for appropriate action to be taken. For example, but not limited to, a change in intensity and/or color of the light from the LEDs 418 may indicate successful actuation of this specific capacitive touch sensor key 200e. It is contemplated and within the scope of this disclosure that the light transmissive layer 616 and/or the target 622 over the capacitive sensor plate 620 may be any type of material that affects the capacitance value of the capacitive sensor plate 620 when there is a change in distance therebetween.

Figure 10:
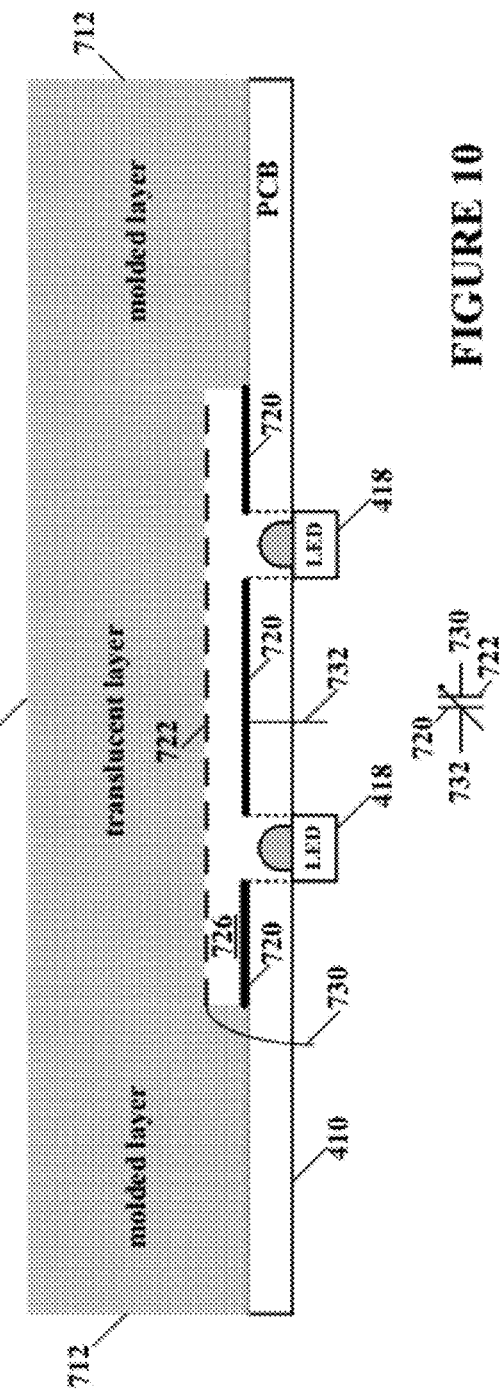
FIG. 10 illustrates a schematic elevational view of a backlighted capacitive touch key comprising a translucent layer having a light transmissive and electrically conductive coating thereon for light to pass therethrough, according to yet another specific example embodiment of this disclosure.

Referring to FIG. 10, depicted is a schematic elevational view of a back-lighted capacitive touch key comprising a translucent layer having a light transmissive and electrically conductive coating thereon for light to pass therethrough, according to yet another specific example embodiment of this disclosure. A back-lighted capacitive touch key 200f comprises a substrate 410, e.g., a printed circuit board (PCB); a capacitive sensor plate 720, a light source, e.g., light emitting diodes (LEDs) 418; a non-translucent (opaque) molded spacer layer 712 surrounds the capacitive sensor plate 720 and LEDs 418, a light transmissive (translucent) layer 716, and a light transmissive and electrically conductive coating 722 disposed a face of the translucent layer 716 and proximate to the capacitive sensor plate 720. The capacitor formed thereby may be connected to the capacitive touch AFE 404 with conductors 730 and 732.

The light transmissive and electrically conductive coating 722 may be, for example but is not limited to, indium tin oxide (ITO), antimony tin oxide (ATO), graphene, etc. Graphene is an allotrope of carbon and may be used as an electrically conductive, light transparent coating. It's structure may be one-atom-thick planar sheets of sp2-bonded carbon atoms that are densely packed in a honeycomb crystal lattice. The substrate 410 may also be made of a light transmissive (translucent) material, e.g., glass, plastic, etc., with a light transmissive and electrically conductive coating, e.g., ITO, ATO, graphene, etc., used for the capacitive sensor plate 720. This light transmissive configuration allows placement of the LEDs 418 outside of (behind) the substrate 410 without physical penetration therein.

The molded spacer layer 612 surrounding the capacitive sensor plate 720 and LEDs 418 is substantially non-translucent (opaque) so that light does not bleed over to another adjacent back-lighted capacitive touch key (not shown). The LEDs 418 (light source) may be mounted on top of the substrate 410 (e.g., LED 218 of FIG. 5) and inside of a cavity 726 formed by the substrate 410, the molded spacer layer 612 and the metallic target layer 722. The LEDs 418 may also be mounted in the substrate 410 as shown. LEDs 418 may be on either side and/or inside of the capacitive sensor plate 720. The light transmissive (translucent) layer 716 and a light transmissive and electrically conductive coating 722 disposed thereon allow for light from the LEDs 418 to pass through. The layer 716 may also be used for protection from physical abuse and/or harmful water and/or chemical infiltration.

The capacitive touch AFE 404 (FIG. 4) detects a change in capacitance of the sensor plate 720 and electrically conductive coating 722, and indicates this event to the digital processor 406 for appropriate action to be taken. For example, but not limited to, a change in intensity and/or color of the light from the LEDs 418 may indicate successful actuation of this specific capacitive touch sensor key 200f. It is contemplated and within the scope of this disclosure that the light transmissive layer 716 and/or the (target) electrically conductive coating 722 over the capacitive sensor plate 720 may be any type of material that affects the capacitance value of the capacitive sensor plate 720 when there is a change in distance therebetween, such that the coating 722 is light transmissive.

Referring to FIGS. 11 and 12, depicted are schematic elevational views of capacitive touch keys having a light source layer over the capacitive touch key and a translucent layer over the light source layer, according to still other specific example embodiments of this disclosure. The capacitive touch keys 200g and 200h comprise substrates 210 and 410, e.g., printed circuit board, sensor plates 1120 and 1220 deposed on the substrates 210 and 410, deformable conductive targets 1122 and 1222 above the sensor plates 1120 and 1220, a light emitting layer 1236, e.g., organic light emitting diode (OLED) layer, electro-luminescent (EL) layer, etc.; a flexible shield over-layer 1114, e.g., metallic over-layer 214 described more fully hereinabove; a light emitting layer 1136 disposed over the flexible shield over-layer 1114, a molded spacer layer 212 and 712, and a translucent over-mold button 216 or a light transmissive (translucent) layer 716. The light emitting layer 1136, 1236 may be used to replace the LEDs 418 as a light source and may further be configured to also function as the target 1236, e.g., the side of the light emitting layer 1236 facing the sensor plate 1220 may be at ground potential and act as one plate of the capacitive touch sensor. The light emitting layer 1236 may be powered through conductors 1230 and 1234. Functionally, operation of the capacitive touch sensor 200g, 200h operates in substantially the same way as the other capacitive touch sensors described herein.

An OLED (organic light-emitting diode) is a light-emitting diode (LED) in which the emissive electroluminescent layer is a film of organic compounds which emit light in response to an electric current. This layer of organic semiconductor material is situated between two electrodes. Generally, at least one of these electrodes is transparent. Electroluminescence (EL) is an optical phenomenon and electrical phenomenon in which a material emits light in response to the passage of an electric current or to a strong electric field.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A backlit capacitive touch sensor key, comprising:
   a substrate;
   a capacitive sensor plate on the substrate;
   a light source;
   a spacer layer on the substrate, wherein the spacer layer has an opening that surrounds the capacitive sensor plate and the light source;
   a flexible light translucent layer;
   a metal target attached to a face of the flexible light translucent layer proximate to the capacitive sensor plate, wherein the metal target has opening therein to allow light to pass therethrough;
   the flexible light translucent layer is attached to the spacer layer over the capacitive sensor plate and light source, wherein a light transmission cavity is formed between the substrate and the flexible light translucent layer and metal target;
   whereby when the flexible light translucent layer and metal target are biased toward the capacitive sensor plate, a capacitance value of the capacitive sensor plate changes.

2. The backlit capacitive touch sensor key according to claim 1, wherein the light source is at least one light emitting diode (LED).

3. The backlit capacitive touch sensor key according to claim 1, wherein the light source is an organic light emitting diode (OLED) layer.

4. The backlit capacitive touch sensor key according to claim 1, wherein the light source is an electroluminescence (EL) layer.

5. The backlit capacitive touch sensor key according to claim 1, wherein the metal target is light opaque and has at least one opening therein for light from the light source to pass therethrough.

6. The backlit capacitive touch sensor key according to claim 1, further comprising a flexible over-layer over the flexible light translucent layer.

7. The backlit capacitive touch sensor key according to claim 6, wherein the flexible over-layer is made of light transmissive material.

8. The backlit capacitive touch sensor key according to claim 6, wherein the flexible over-layer is made of light opaque material and has opening therein for light from the light source to pass therethrough.

9. The backlit capacitive touch sensor key according to claim 8, wherein the flexible over-layer is metal.

10. The backlit capacitive touch sensor key according to claim 8, wherein the flexible over-layer is nonmetallic.

11. The backlit capacitive touch sensor key according to claim 1, wherein the substrate is a printed circuit board.

\* \* \* \* \*